(12) United States Patent
Chen et al.

(10) Patent No.: US 10,918,209 B1
(45) Date of Patent: Feb. 16, 2021

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/711,781

(22) Filed: Dec. 12, 2019

(30) Foreign Application Priority Data

Aug. 14, 2019 (TW) .............................. 108129196 A

(51) Int. Cl.
*A47B 88/00* (2017.01)
*A47B 88/477* (2017.01)
*A47B 88/49* (2017.01)
*A47B 88/483* (2017.01)

(52) U.S. Cl.
CPC .......... *A47B 88/477* (2017.01); *A47B 88/483* (2017.01); *A47B 88/49* (2017.01)

(58) Field of Classification Search
CPC ..... A47B 88/477; A47B 88/483; A47B 88/49; A47B 88/57; A47B 2088/4235
See application file for complete search history.

(56) References Cited

U.S. PATENT DOCUMENTS

| | | | | |
|---|---|---|---|---|
| 6,367,899 B1* | 4/2002 | Hwang | ................. | A47B 88/57 312/334.47 |
| 6,945,619 B1* | 9/2005 | Chen | ................... | A47B 88/487 312/334.47 |
| 9,629,459 B2 | 4/2017 | Chen et al. | | |
| 9,681,749 B2 | 6/2017 | Chen et al. | | |
| 9,992,906 B2 | 6/2018 | Chen et al. | | |
| 10,041,535 B2 | 8/2018 | Chen et al. | | |
| 2004/0174100 A1* | 9/2004 | Chen | ................... | A47B 88/487 312/333 |
| 2004/0174104 A1* | 9/2004 | Chen | ................... | A47B 88/487 312/334.47 |
| 2005/0162052 A1* | 7/2005 | Chen | ................... | A47B 88/487 312/334.5 |
| 2006/0078235 A1* | 4/2006 | Chen | ................... | A47B 88/493 384/18 |

(Continued)

*Primary Examiner* — Matthew W Ing
(74) *Attorney, Agent, or Firm* — Alan D. Kamrath; Karin L. Williams; Mayer & Williams PC

(57) ABSTRACT

A slide rail assembly includes a first rail, a second rail, a blocking member, a working member and an operating member. The blocking member is arranged on one of the first rail and the second rail. The working member is arranged on the other one of the first rail and the second rail. When the second rail is moved relative to the first rail from a retracted position to an extension position, the working member and the blocking member are configured to block each other in order to prevent the second rail from being moved from the extension position along a retracting direction. When the operating member is operated, the operating member is configured to contact one of the working member and the blocking member in order to keep the working member and the blocking member in a state without blocking each other.

17 Claims, 13 Drawing Sheets

(56) References Cited

U.S. PATENT DOCUMENTS

| | | | |
|---|---|---|---|
| 2008/0034662 A1* | 2/2008 | Peng | A47B 88/57 49/175 |
| 2012/0308297 A1* | 12/2012 | Chen | A47B 88/49 403/109.2 |
| 2016/0296017 A1* | 10/2016 | Chen | A47B 96/061 |
| 2017/0082143 A1* | 3/2017 | Chen | F16C 29/12 |
| 2018/0031037 A1* | 2/2018 | Chen | A47B 88/43 |
| 2020/0221868 A1* | 7/2020 | Hsu | A47B 88/43 |

* cited by examiner

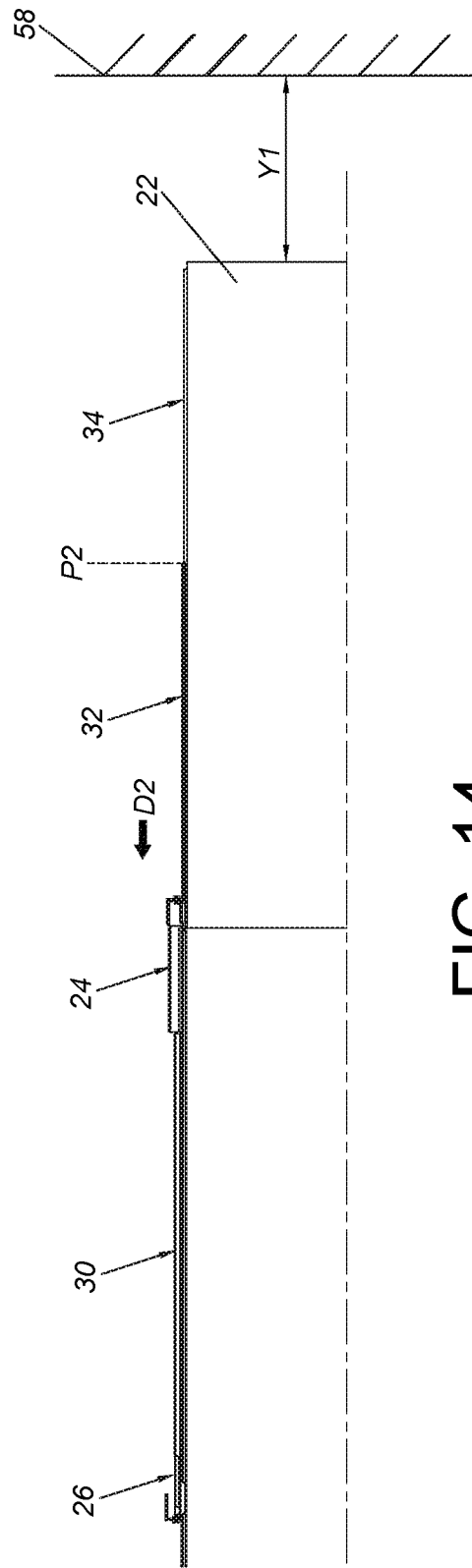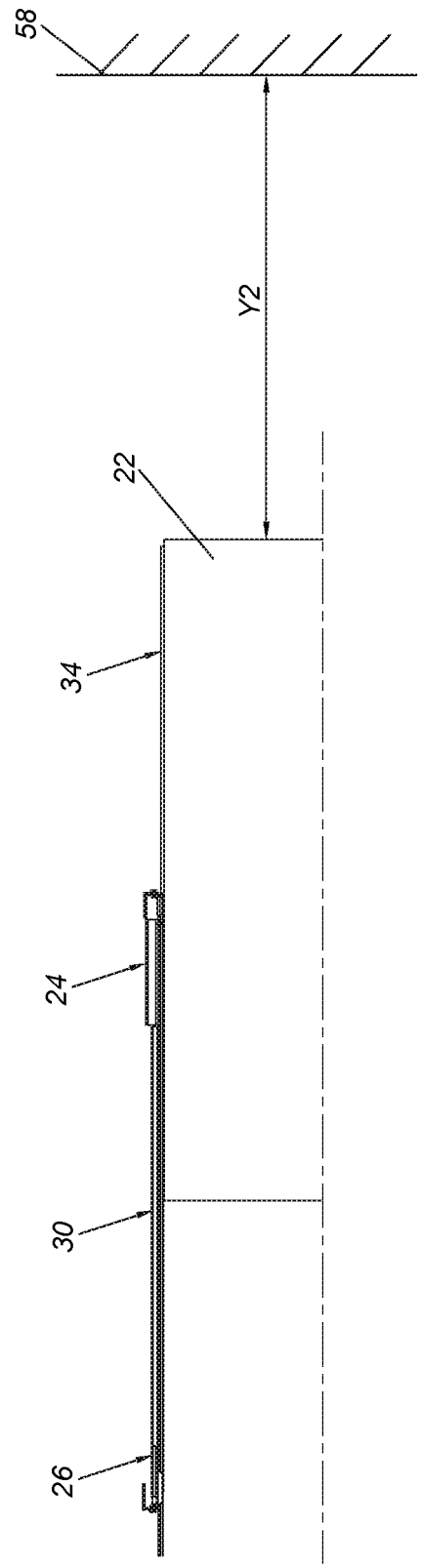

SLIDE RAIL ASSEMBLY

BACKGROUND OF THE INVENTION

1. Field of the Invention

The present invention relates to a slide rail assembly, and more particularly, to a slide rail assembly having an operating member to disengage two slide rails.

2. Description of the Prior Art

U.S. Pat. No. 9,681,749 B2 discloses a slide rail assembly comprising a first rail, a second rail, a blocking member, a positioning member and an operating member. The blocking member is attached to the first rail. The positioning member is arranged on the second rail. The operating member is movably connected to the first rail.

When the second rail is moved relative to the first rail to an extension position, the positioning member is blocked by the blocking member to prevent the second rail from being retracted from the extension position along a retracting direction. A user can apply a force to the operating member to move the operating member from an initial position to a predetermined position. During a process of moving the operating member to the predetermined position, the operating member is configured to drive the blocking member of the first rail to move, such that the blocking member is in a non-blocking state without blocking the positioning member, so as to allow the second rail to be retracted from the extension position along the retracting direction.

Moreover, a return elastic member is configured to apply an elastic force to the operating member of the aforementioned patent to move the operating member from the predetermined position to the initial position. In other words, once the user stop applying the force to the operating member, the operating member is forced to move from the predetermined position to the initial position in response to the elastic force of the return elastic member.

Therefore, when the user stops applying the force to the operating member, the operating member is no longer held at the predetermined position to keep the blocking member in the non-blocking state. However, such mechanism with the operating member configured to be forced to move to the initial position by the elastic force of the return elastic member can not meet specific market requirements.

Therefore, it is important to develop a different slide rail assembly.

SUMMARY OF THE INVENTION

The present invention provides a slide rail assembly having an operating member to disengage two slide rails to allow a rail to be retracted relative to another rail from an extended position.

According to an embodiment of the present invention, a slide rail assembly comprises a first rail, a second rail, a blocking member, a working member and an operating member. The second rail is movable relative to the first rail. The blocking member is arranged on one of the first rail and the second rail. The working member is arranged on the other one of the first rail and the second rail. The operating member is operatively movable between a first predetermined position and a second predetermined position. When the second rail is moved relative to the first rail from a retracted position to an extension position along an opening direction, the working member and the blocking member are configured to block each other in order to prevent the second rail from being moved from the extension position toward the retracted position along a retracting direction. When the operating member is operated to move from the first predetermined position to the second predetermined position, the operating member is configured to contact one of the working member and the blocking member, in order to keep the working member and the blocking member in a state without blocking each other.

Preferably, the operating member is movably arranged on the first rail.

Preferably, the blocking member is arranged on the first rail and the working member is movably mounted to the second rail.

Preferably, the blocking member comprises a guiding section and a blocking wall. During a process of the second rail being moved relative to the first rail from the retracted position to the extension position along the opening direction, the working member is configured to be guided through the guiding section to a position adjacent to the blocking wall.

Preferably, the working member is pivotally connected to the second rail, and the slide rail assembly further comprises an elastic member configured to provide an elastic force to the working member, such that the working member is configured to be blocked by the blocking wall in response to the elastic force.

Preferably, one of the operating member and the first rail is arranged with a guiding feature, and the other one of the operating member and the first rail is arranged with a mounting member configured to interact with the guiding feature to allow the operating member to move relative to the first rail.

Preferably, the guiding feature is a bounded longitudinal elongated hole, and the mounting member is a protruded structure penetrating through a portion of the longitudinal elongated hole.

Preferably, a first end part and a second end part of the first rail are configured to be respectively mounted to a first post and a second post through a first bracket and a second bracket.

Preferably, the first rail has a first side and a second side opposite to the first side, and the operating member is mounted to one of the first side and the second side.

According to another embodiment of the present invention, a slide rail assembly comprises a first rail, a second rail, a blocking member, a working member and an operating member. The second rail is movable relative to the first rail. The blocking member is arranged on the first rail. The working member is arranged on the second rail. The operating member is operatively movable on the first rail. When the second rail is moved relative to the first rail from a retracted position to an extension position along an opening direction, the working member is blocked by the blocking member. The operating member is configured to drive the working member to move to be no longer blocked by the blocking member, in order to allow the second rail to move from the extension position toward the retracted position along a retracting direction.

According to another embodiment of the present invention, a slide rail assembly comprises a first rail, a second rail, a blocking member, a working member and an operating member. The second rail is movable relative to the first rail. The blocking member is arranged on the first rail. The working member is arranged on the second rail. The operating member is movable relative to the first rail between a first predetermined position and a second predetermined position. When the second rail is located at an extension position relative to the first rail, the working member and the blocking member are configured to block each other. When the operating member is operated to move from the first predetermined position to the second predetermined position, the operating member is configured to keep one of the working member and the blocking member in a non-blocking state to prevent the working member and the blocking member from blocking each other, in order to allow the second rail to be retractable from the extension position along a retracting direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14 is a diagram showing the slide rail assembly being configured to mount the carried object to the rack with the slide rail assembly being in the extended state to have an extension length to be used in a narrow environment according to an embodiment to the present invention;

FIG. 15 is a diagram showing the slide rail assembly being configured to mount the carried object to the rack with the second rail being retracted relative to the first rail to reduce the extension length of the slide rail assembly according to an embodiment to the present invention;

DETAILED DESCRIPTION

Figure 1:
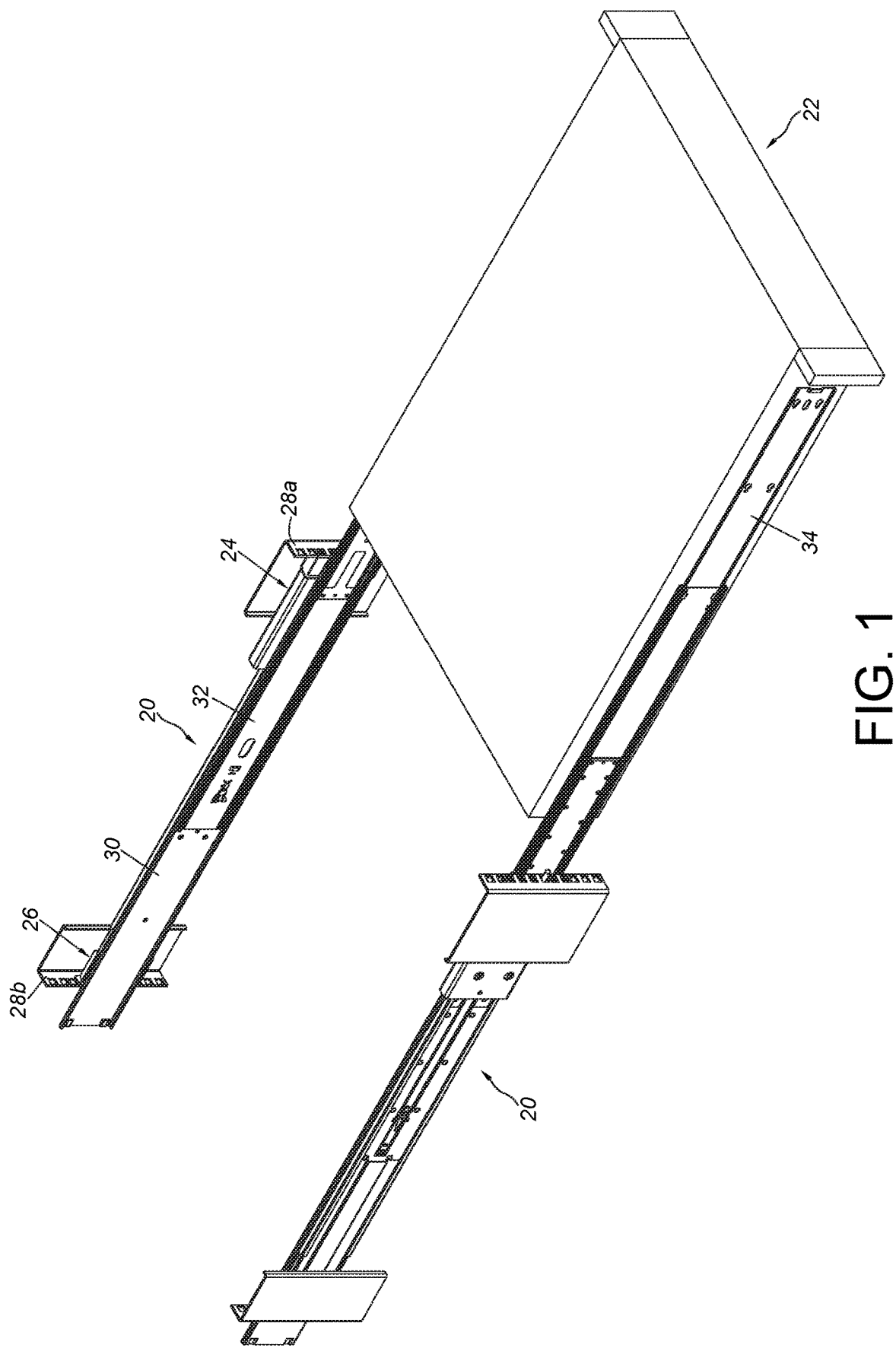
FIG. 1 is a diagram showing slide rail assemblies configured to mount a carried object to a rack according to an embodiment of the present invention.

As shown in FIG. 1, a pair of slide rail assemblies 20 is configured to mount a carried object 22 to a rack according to an embodiment of the present invention. The slide rail assemblies 20 are substantially identical to each other. Furthermore, each of the slide rail assemblies 20 comprises a first rail 30, a second rail 32 and a third rail 34 telescopically movable relative to one another. Two end parts of the first rail 30 are mounted to a first post 28a and a second post 28b of the rack through a first bracket 24 and a second bracket 26 respectively.

Figure 2:
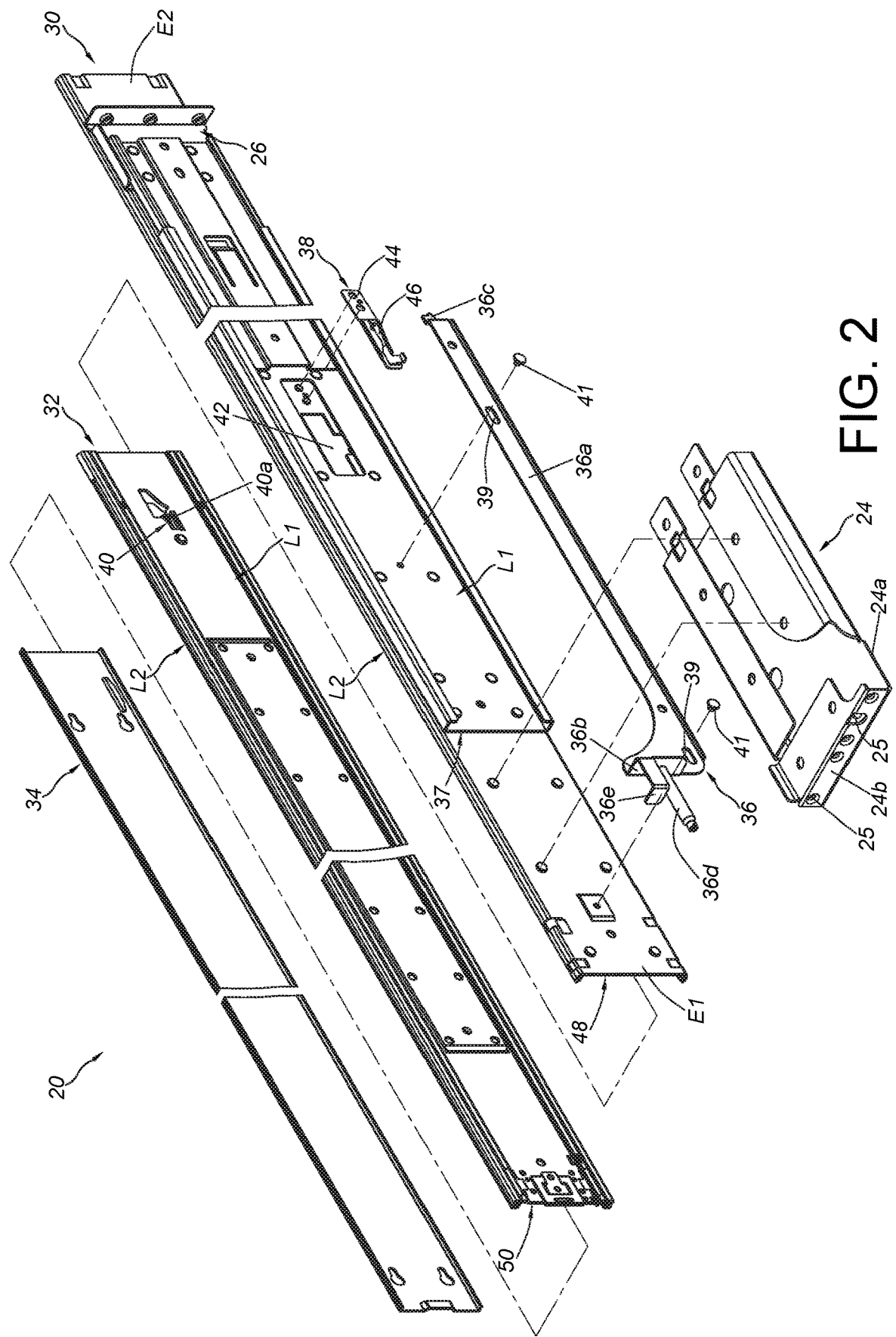
FIG. 2 is an exploded view of the slide rail assembly according to an embodiment of the present invention.
Figure 3:
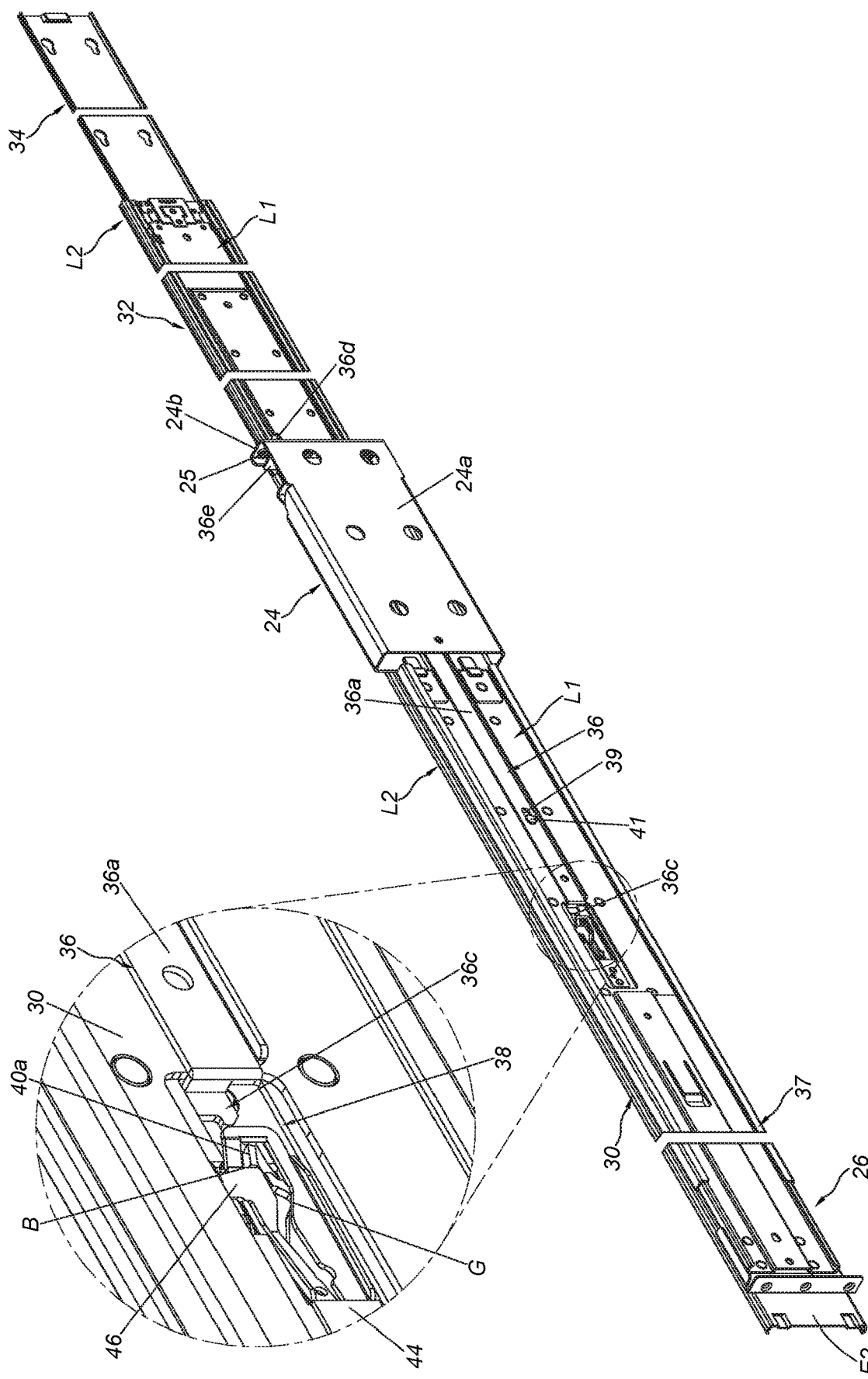
FIG. 3 is a diagram showing the slide rail assembly comprising a first rail, a second rail and a third rail according to an embodiment to the present invention.

As shown in FIG. 2 and FIG. 3, the slide rail assembly 20 further comprises an operating member 36, a blocking member 38 and a working member 40.

The operating member 36 is operatively arranged on the first rail 30. Moreover, the first rail 30 has a first side L1 and a second side L2 opposite to the first side L1, and the operating member 36 is arranged on one of the first side L1 and the second side L2. In the present embodiment, the operating member 36 is movably arranged on the first side L1 of the first rail 30.

Preferably, one of the operating member 36 and the first rail 30 is arranged with a guiding feature 39, and the other one of the operating member 36 and the first rail 30 is arranged with a mounting member 41. In the present embodiment, the guiding feature 39 is a bounded longitudinal elongated hole, and the mounting member 41 is a protruded structure penetrating through a portion of the longitudinal elongated hole. Through interaction of the mounting member 41 and the guiding feature 39, the operating member 36 is longitudinally movable relative to the first rail 30 within a limited range. Preferably, the slide rail assembly 20 can have a plurality of the guiding features and a plurality of mounting members.

Preferably, the operating member 36 comprises an extended body 36a, a bending part 36b, a driving part 36c, a linking feature 36d and an operating part 36e. The extended body 36a is extended in a direction substantially identical to a longitudinal direction of the first rail 30, and the extended body 36a is arranged between the bending part 36b and the driving part 36c. The bending part 36b is bent relative to the extended body 36a. Preferably, the bending part 36b is substantially perpendicularly connected to the extended body 36a, and the driving part 36c is bent relative to the extended body 36a. The linking feature 36d can be a pin member. The linking feature 36d and the operating part 36e are respectively extended from the bending part 36b. Preferably, the linking feature 36d is longitudinally arranged, and the linking feature 36d and the operating part 36e are configured to receive a force from a user or an external object to move the operating member 36 from one position to another position.

Preferably, the first rail 30 is arranged with a reinforcing member 37 at the first side L1, and the reinforcing member 37 is fixed to the first side L1 and can be regarded as a portion of the first rail 30. Preferably, the first rail 30 has an opening 42 communicated with the first side L1 and the second side L2 of the first rail 30. In addition, the first bracket 24 is arranged adjacent to a first end part E1 (such as a front end part) of the first rail 30. Preferably, the first bracket 24 comprises a side wall 24a and an end wall 24b. The side wall 24a is connected (such as fixedly connected) to the first rail 30, and the end wall 24b is bent relative to the side wall 24a. In the present embodiment, the end wall 24b is substantially perpendicularly connected to the side wall 24a. Preferably, the end wall 24b has a plurality of through holes 25 (as shown in FIG. 2). The linking feature 36d of the operating member 36 is configured to pass through one of the through holes 25. On the other hand, the second bracket 26 is arranged adjacent to a second end part E2 (such as a rear end part) of the first rail 30. Preferably, the second bracket 26 is longitudinally adjustable relative to the first rail 30 through a reinforcing passage of the reinforcing member 37.

The blocking member 38 is arranged on one of the first rail 30 and the second rail 32. In the present embodiment, the blocking member 38 is arranged on the first rail 30. Preferably, the blocking member 38 is located adjacent to the opening 42 of the first rail 30. The blocking member 38 comprises a connecting part 44 and a functioning part 46. The connecting part 44 is connected (such as fixedly connected) to the first rail 30, and the functioning part 46 is extended from the connecting part 44. Preferably, the functioning part 46 corresponds to the opening 42 of the first rail 30. Preferably, the functioning part 46 of the blocking member 38 comprises a guiding section G and a blocking wall B adjacent to the guiding section G (please to FIG. 3). Preferably, the guiding section G has an inclined surface or an arc surface, but the present invention is not limited thereto.

The second rail 32 is movable relative to the first rail 30. Preferably, the second rail 32 is movably mounted to a first passage 48 of the second side L2 of the first rail 30.

The third rail 34 is movable relative to the second rail 32. Preferably, the third rail 34 is movably mounted to a second passage 50 of a second side L2 of the second rail 32.

Figure 5:
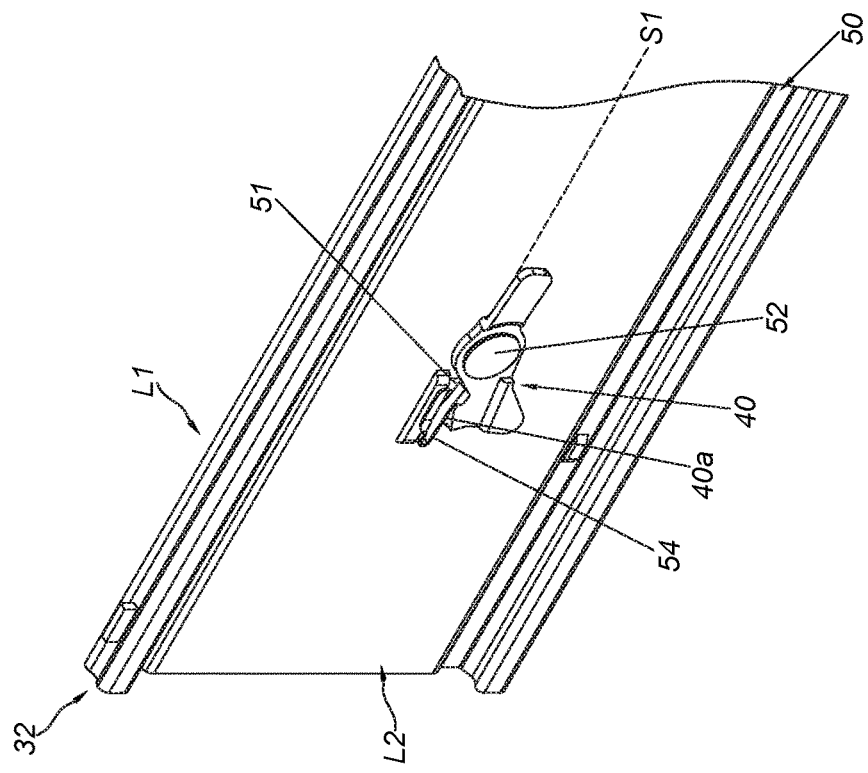
FIG. 5 is a diagram showing the second rail and the working member of the slide rail assembly according to an embodiment to the present invention.
Figure 4:
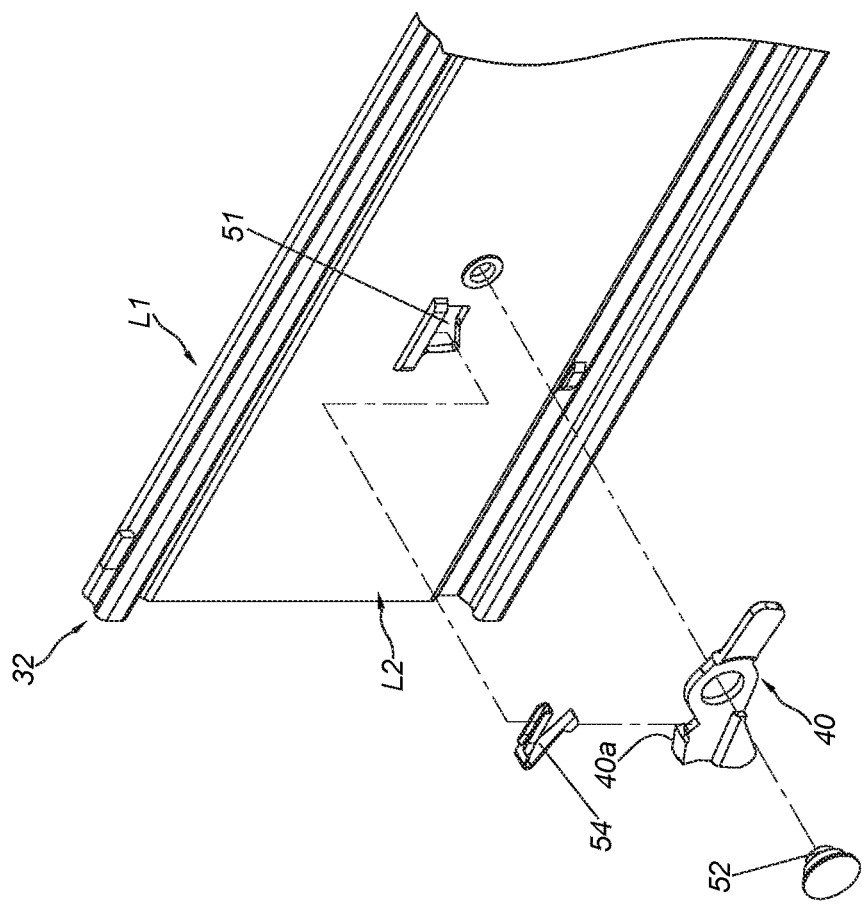
FIG. 4 is an exploded view of the second rail and a working member of the slide rail assembly according to an embodiment to the present invention.

As shown in FIG. 4 and FIG. 5, the working member 40 is arranged on the other one of the first rail 30 and the second rail 32. In the present embodiment, the working member 40 is arranged on the second rail 32. Preferably, the second rail 32 has an auxiliary opening 51 communicated with a first side L1 and the second side L2 of the second rail 32. The working member 40 is movably mounted to the second rail 32. In the preset embodiment, the working member 40 is pivotally connected to the second side L2 of the second rail 32 through a shaft 52. Preferably, the slide rail assembly 20 further comprises an elastic member 54 configured to provide an elastic force to the working member 40, in order to hold the working member 40 in a first state S1. Preferably, the working member 40 comprises an extension part 40a. The extension part 40a is extended from the second side L2 of the second rail 32 to the first side L1 of the second rail 32, and the extension part 40a is configured to extend toward the second side L2 of the first rail 30.

Figure 6:
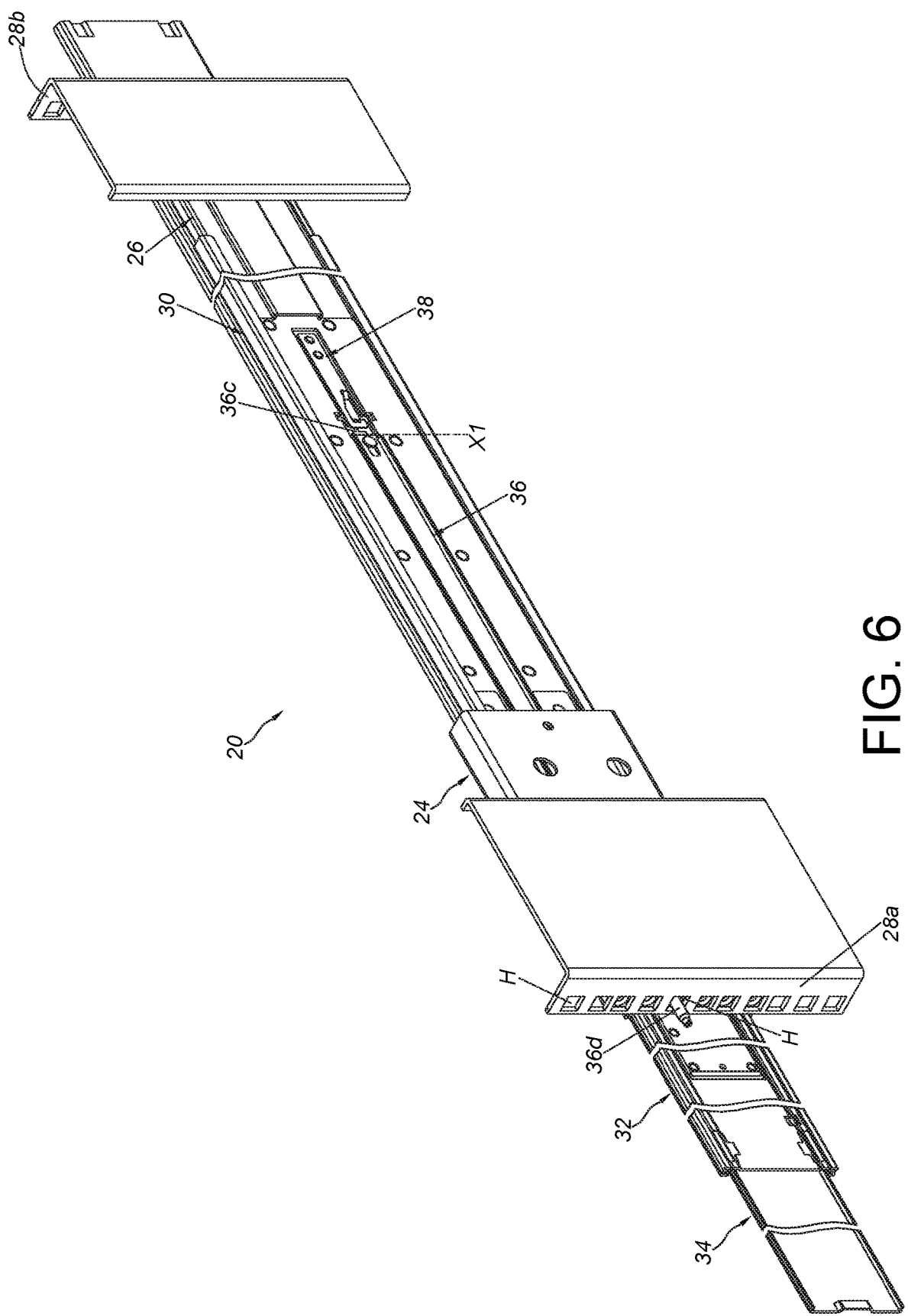
FIG. 6 is a diagram showing the slide rail assembly being mounted to the rack according to an embodiment to the present invention.

As shown in FIG. 6, the slide rail assembly 20 is mounted to the first post 28a and the second post 28b through the first bracket 24 and the second bracket 26. The linking feature 36d of the operating member 36 is configured to penetrate through one of a plurality of mounting holes H of the first post 28a.

Figure 7:
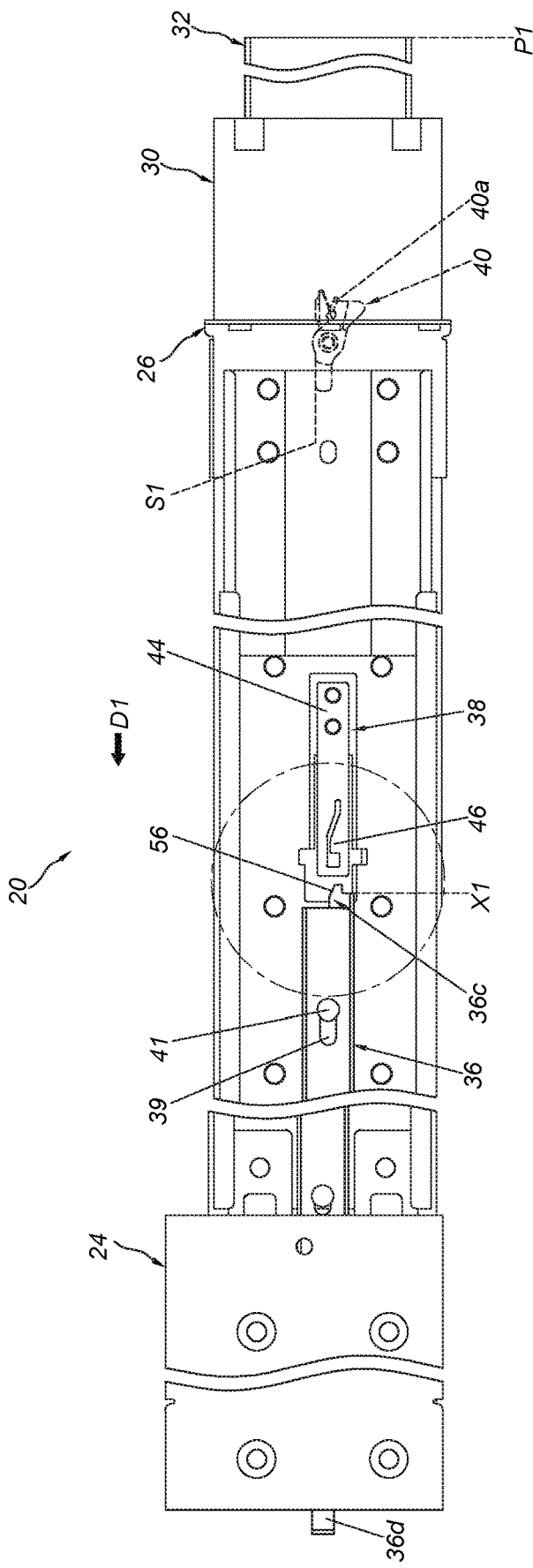
FIG. 7 is a diagram showing the slide rail assembly being in a retracted state according to an embodiment to the present invention.

As shown in FIG. 7, the slide rail assembly 20 is in a retracted state. The second rail 32 (and the third rail 34 which is not shown in FIG. 7) is located at a retracted position P relative to the first rail 30. The working member 40 of the second rail 32 is apart from the blocking member 38 of the first rail 30, and the working member 40 is in the first state S1. In addition, the operating member 36 is located at a first predetermined position X1. Furthermore, the second rail 32 (and the third rail 34) is movable relative to the first rail 30 from the retracted position P1 along an opening direction D1.

Figure 9:
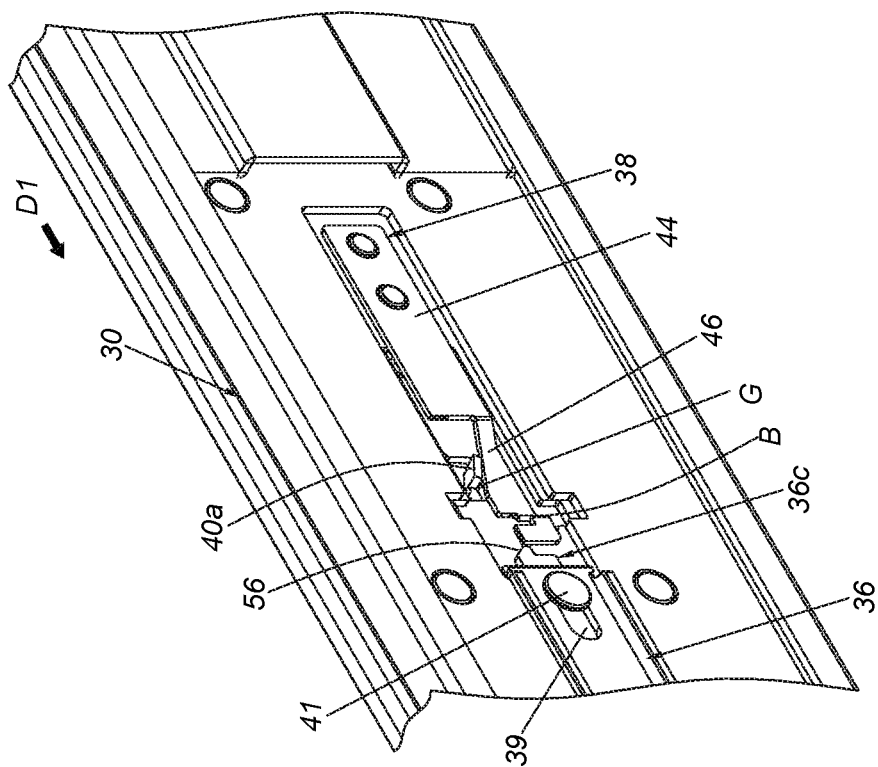
FIG. 9 is a diagram showing the second rail of the slide rail assembly being moved relative to the first rail along the opening direction according to an embodiment to the present invention.
Figure 8:
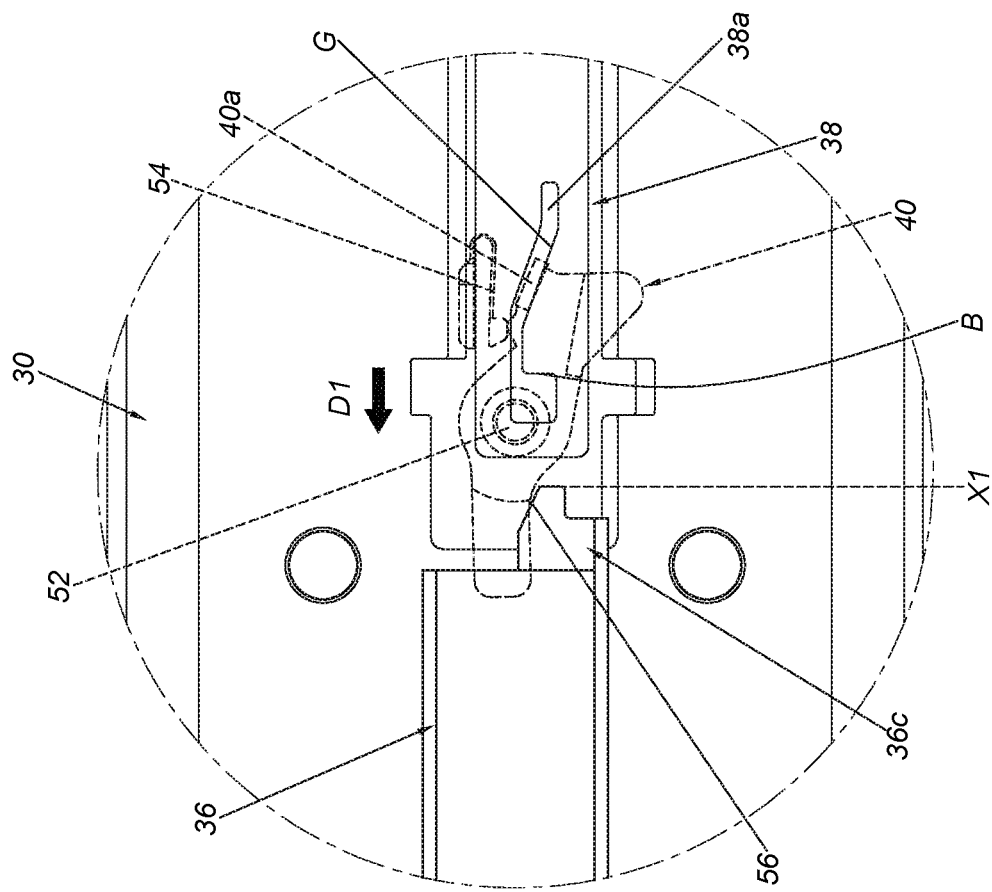
FIG. 8 is a diagram showing the second rail of the slide rail assembly being moved relative to the first rail along an opening direction according to an embodiment to the present invention.

As shown in FIG. 8 and FIG. 9, during a process of the second rail 32 being moved relative to the first rail 30 along the opening direction D1 (FIG. 8 and FIG. 9 only show the working member 40 to illustrate movement of the second rail 32 along the opening direction D1), the extension part 40a of the working member 40 is guided by the guiding section G of the blocking member 38 of the first rail 30, so as to deflect the working member 40 to be no longer in the first state S1. In the meantime, the elastic member 54 accumulates an elastic force. Moreover, the driving part 36c of the operating member 36 comprises a guiding portion 56. Preferably, the guiding portion 56 has an inclined surface or an arc surface, but the present invention is not limited thereto. Preferably, the blocking member 38 has a groove 38a. The guiding section G can be an edge wall of the groove 38a, and the extension part 40a of the working member 40 is located inside the groove 38a.

Figure 11:
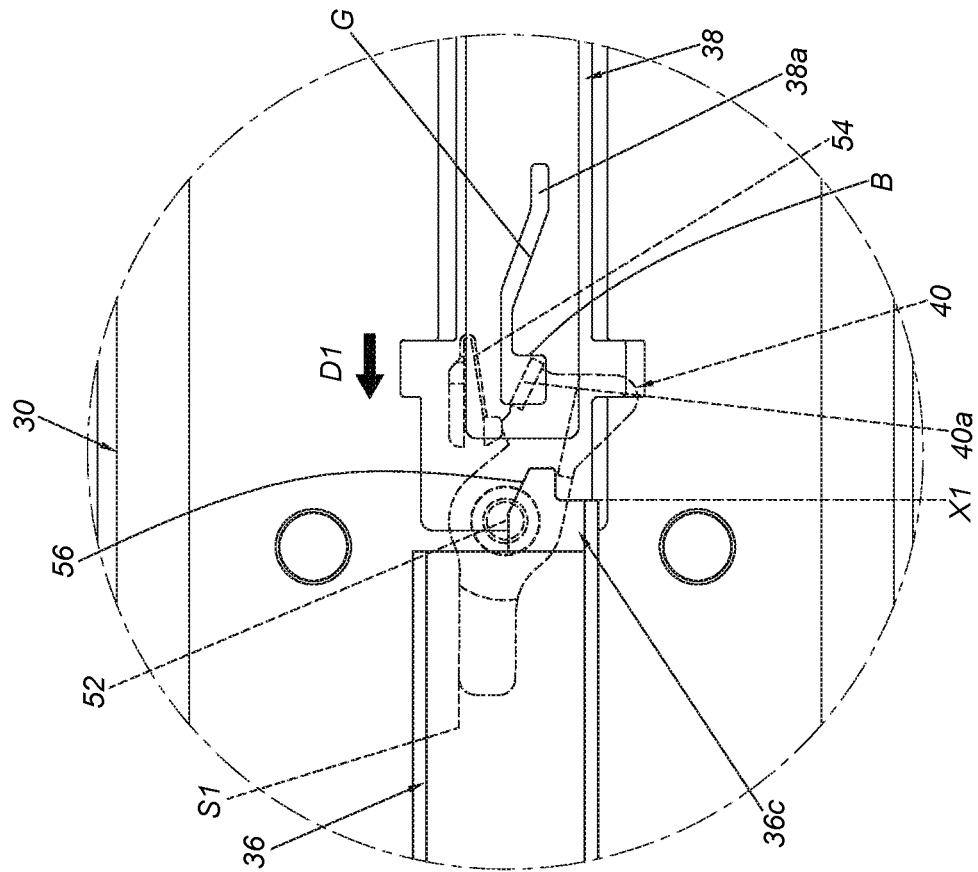
FIG. 11 diagram showing the second rail of the slide rail assembly being further moved relative to the first rail along the opening direction according to an embodiment to the present invention.
Figure 10:
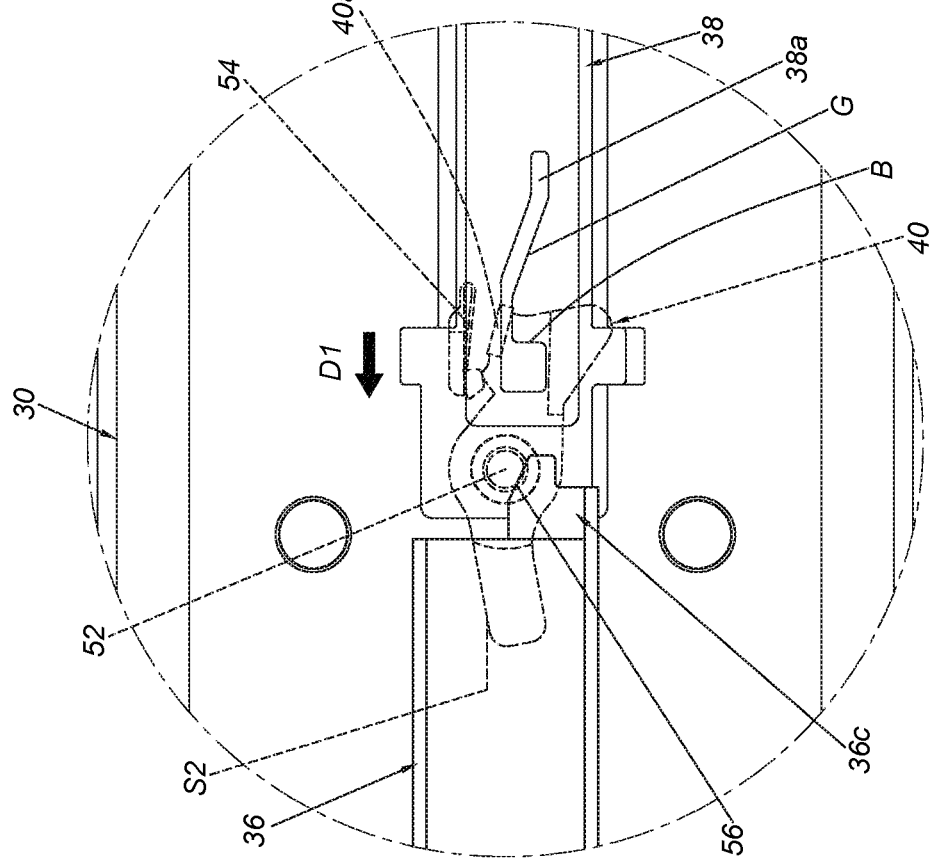
FIG. 10 is a diagram showing the second rail of the slide rail assembly being further moved relative to the first rail along the opening direction according to an embodiment to the present invention.

As shown in FIG. 10 and FIG. 11, when the second rail 32 (FIG. 10 and FIG. 11 only show the working member 40 to represent the second rail 32) is moved relative to the first rail 30 along the opening direction D1 to an extension position P2 (please also refer to FIG. 12), the working member 40 and the blocking member 38 are configured to block each other in order to prevent the second rail 32 from being moved from the extension position P2 toward the retracted position P1.

Figure 12:
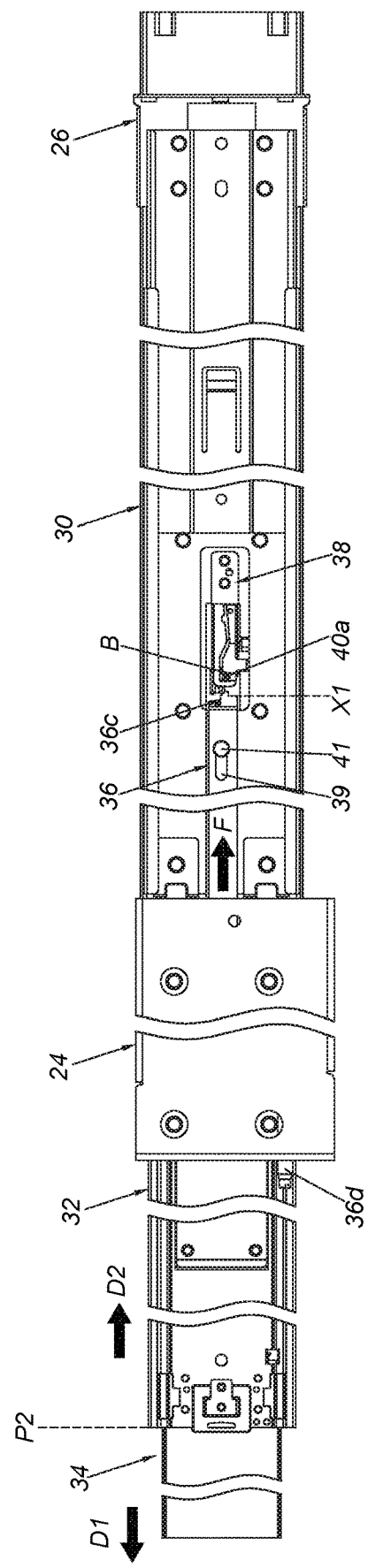
FIG. 12 is a diagram showing the second rail of the slide rail assembly being located at an extension position relative to the first rail with the third rail being movable relative to the second rail along the opening direction according to an embodiment to the present invention.

For example, during the process of the second rail 32 being further moved relative to the first rail 30 along the opening direction D1 to the extension position P2, the extension part 40a of the working member 40 is guided by the guiding section G of the blocking member 38 of the first rail 30 to move along the groove 38a of the blocking member 38. When the extension part 40a of the working member 40 is moved to a location adjacent to the blocking wall B of the blocking member 38, the working member 40 returns to the first state S1 from a second state S2 (as shown in FIG. 10) in response to the elastic force of the elastic member 54, such that the extension part 40a of the working member 40 is blocked by the blocking wall B. In the meantime, the second rail 32 is located at the extension position P2 relative to the first rail 30 (as shown in FIG. 12), and the extension part 40a of the working member 40 is blocked by the blocking wall B of the blocking member 38 in order to prevent the second rail 32 from being retracted from the extension position P2 toward the retracted position P1 along a retracting direction D2. In addition, the third rail 34 can be further moved relative to the second rail 32 along the opening direction D1 (as shown in FIG. 12) to an opening position, such that the slide rail assembly 20 is in an extended state.

Figure 13:
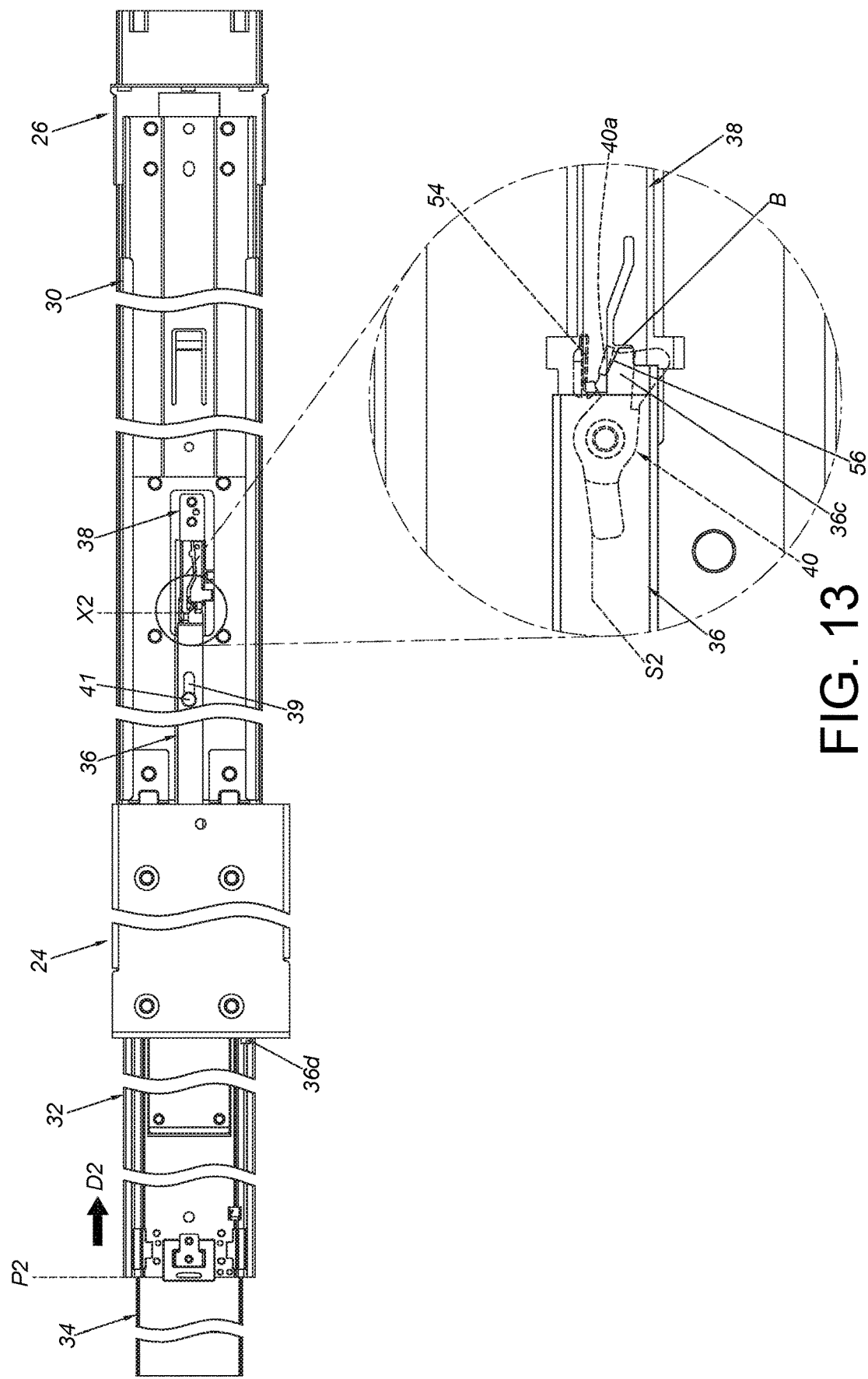
FIG. 13 is a diagram showing the slide rail assembly being in an extended state with the operating member being configured to be operated according to an embodiment to the present invention.

As shown in FIG. 12 and FIG. 13, when the operating member 36 is operated to move from the first predetermined position X1 (such as an initial position shown in FIG. 12) to a second predetermined position X2 (such as a non-initial position shown in FIG. 13), the operating member 36 is configured to contact one of the working member 40 and the blocking member 38, in order to keep the working member 40 and the blocking member 38 in a state without blocking each other. In the present embodiment, the operating member 36 is configured to contact the working member 40, but the present invention is not limited thereto.

Specifically, when the second rail 32 is located at the extension position P2 relative to the first rail 30, a user can apply a force F to the linking feature 36d or the operating part 36e of the operating member 36 to move the operating member 36 relative to the first rail 30 from the first predetermined position X1 (as shown in FIG. 12) to the second predetermined position X2 (as shown in FIG. 13), such that the operating member 36 can contact (such as push or press) the extension part 40a of the working member 40 through the guiding portion 56 of the driving part 36c, to deflect the working member 40 to be no longer in the first state S1 (such as being in the second state S2). Thereby, the extension part 40a of the working member 40 is no longer blocked by the blocking wall B of the blocking member 38, so as to allow the second rail 32 to be moved from the extension position P2 (as shown in FIG. 13) to the retracted position P1 along the retracting direction D2.

Moreover, in contrast to the prior art having an operating member arranged with a return elastic member, the operating member 36 of the present invention is not arranged with any return elastic member. Therefore, when the user stops applying the force F to the operating member 36, the operating member 36 is not forced to move from the second predetermined position X2 to the first predetermined position X1. According to such arrangement, when the operating member 36 is operated to move from the first predetermined position X1 to the second predetermined position X2, the operating member 36 is configured to stay at the second predetermined position X2 and keep one of the working member 40 and the blocking member 38 in a non-blocking state through the driving part 36c (such as keeping the working member 40 in the second state as the non-blocking state) to prevent the working member 40 and the blocking member 38 from blocking each other, so as to allow the second rail 32 to be retracted from the extension position P2 along the retracting direction D2. In addition, the user can further manually operate the operating member 36 to return to the first predetermined position X1 from the second predetermined position X2.

As shown in FIG. 14 and FIG. 15, the carried object 22 is mounted to the rack through the slide rail assembly 20 to be used in an environment. For example, when the second rail 32 is located at the extension position P2 relative to the first rail 30 and when the third rail 34 mounted with the carried object 22 is pulled out relative to the second rail 32 to make the slide rail assembly in the extended state, a first space Y1 is formed between the third rail 34 (or the carried object 22) and an obstacle 58 (such as a wall, a door or other environmental obstacle). However, if the first space Y1 is too narrow, maintenance on the carried object 22 or the slide rail assembly 20 can not be performed smoothly. Therefore, the user can operate the operating member 36 to keep the working member 40 and the blocking member 38 from blocking each other (please refer to FIG. 13 and related illustrations, and no further illustration is provided), in order to retract the second rail 32 relative to the first rail 30 from the extension position P2 to the retracted position P1 along the retracting direction D2. As such, a second space Y2 formed between the third rail 34 (or the carried object 22) and the obstacle 58 is wider, so as to facilitate disassembly of the carried object 22 or the maintenance on the slide rail assembly 20 for the on-site user.

Figure 16:
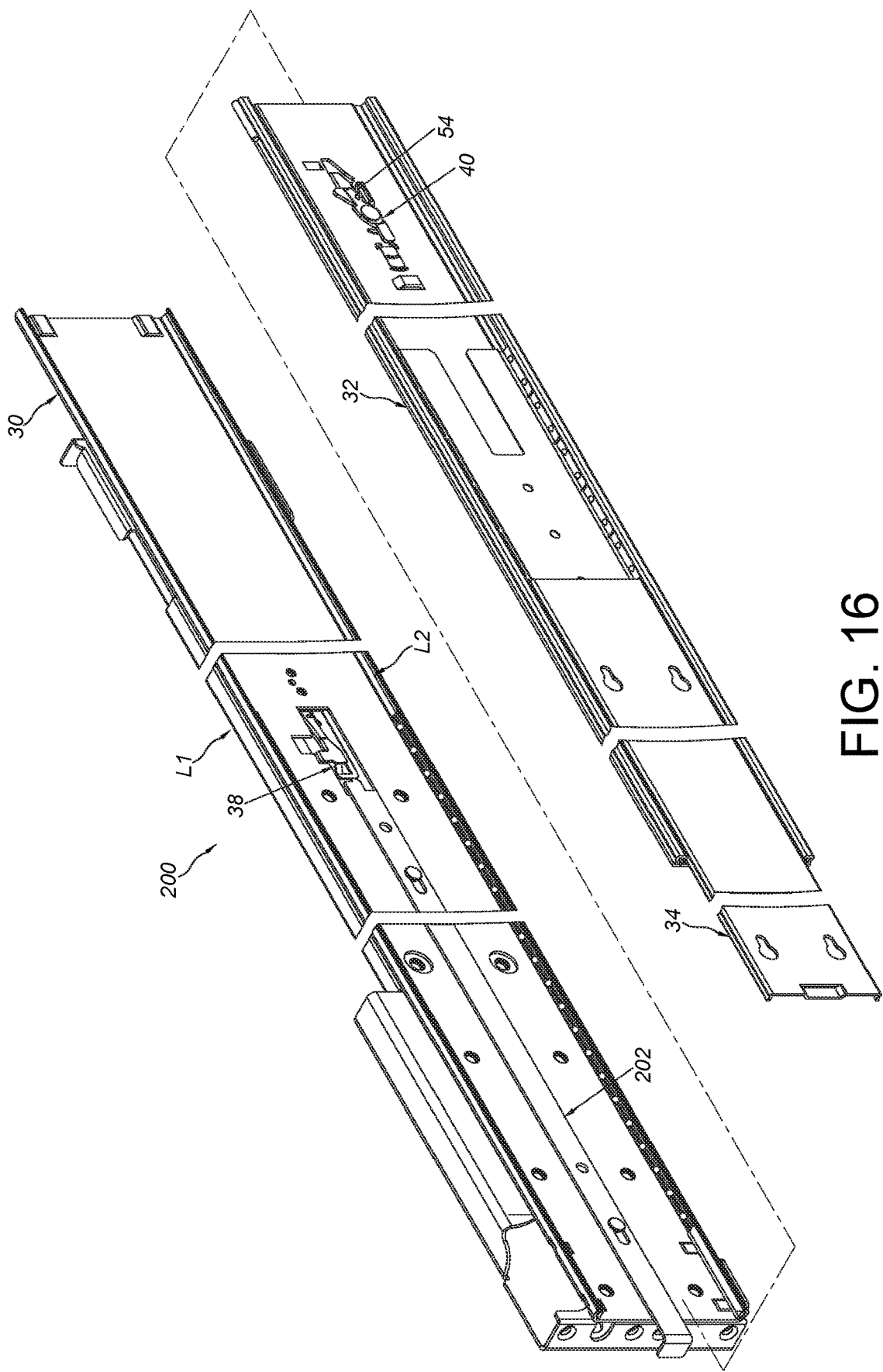
FIG. 16 is an exploded view of the slide rail assembly according to another embodiment of the present invention.

FIG. 16 is a diagram showing an operating member 202 of a slide rail assembly 200 according to another embodiment of the present invention. Furthermore, different from the aforementioned operating member 36 being arranged on the first side L1 of the first rail 30, an operating member 202 of the present embodiment is arranged on the second side L2 of the first rail 30. The operating member 202 can also be operated to keep the working member 40 and the blocking member 38 from blocking each other.

Figure 17:
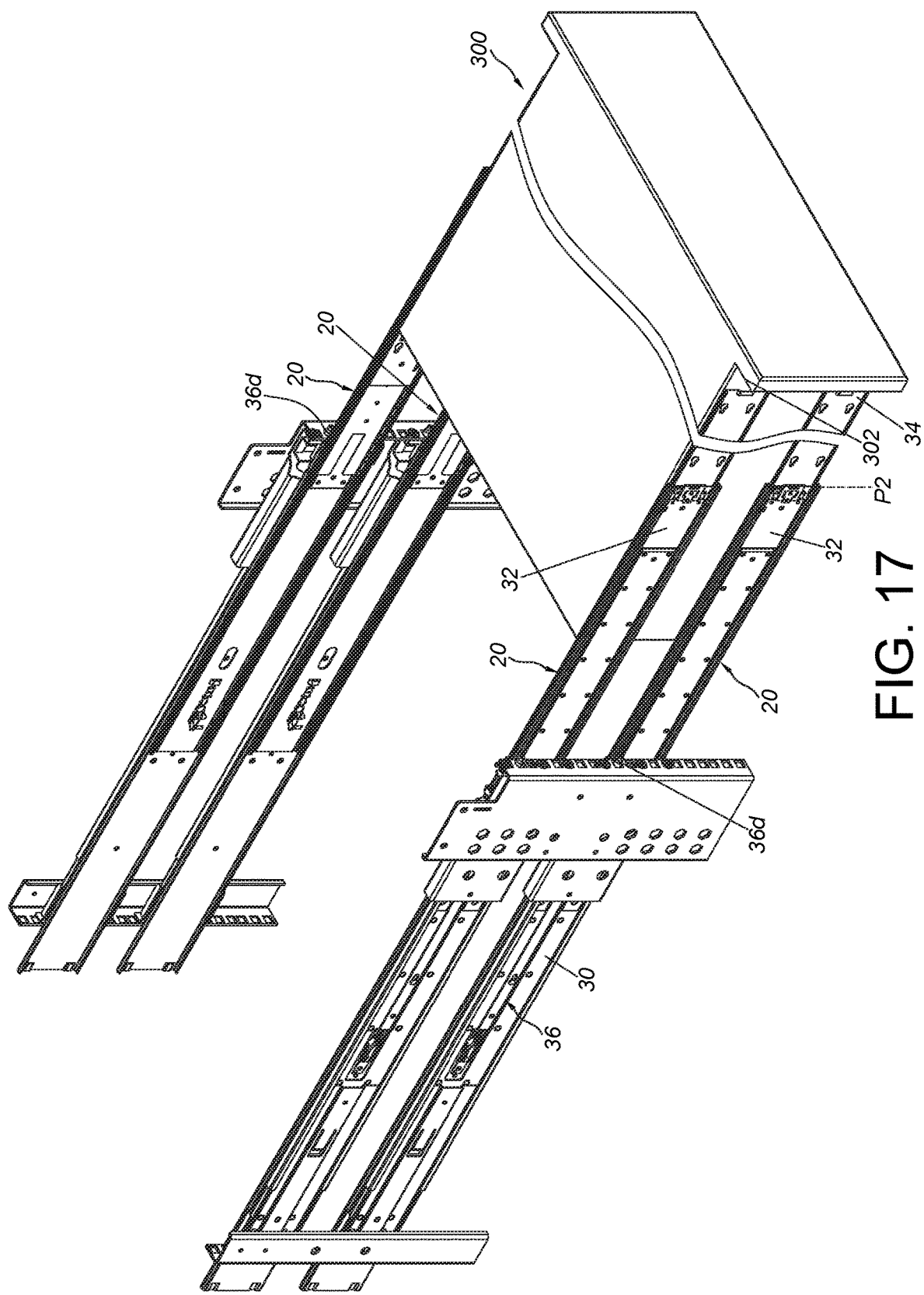
FIG. 17 is a diagram showing a plurality of slide rail assemblies being configured to mount a carried object to the rack according to yet another embodiment to the present invention.

As shown in FIG. 17, upper and lower portions of two lateral sides of a carried object 300 are respectively arranged with the slide rail assemblies 20. As illustrated above, since the operating member 36 of the embodiment of the present invention is not arranged with any return elastic member, the operating member 36 can be temporarily held at one position after being operated. Therefore, the operating members 36 of the slide rail assemblies 20 do not require multiple users to operate. That is, when the second rails 32 of the slide rail assemblies 20 are located at the extension position P2 relative to the first rail 30, a single user can apply the forces to the operating members 36 of the slide rail assemblies 20 to move the operating members 36 from the predetermined position X1 to the second predetermined position X2, so as to allow the second rails 32 of the slide rail assemblies 20 to be retracted from the extension position P2 in the retracting direction D2, such that the on-site user or a maintenance staff can easily perform retraction operations of the slide rail assemblies 20 or related maintenance operations. Moreover, when the third rails 34 are retracted from the opening position along the retracting direction D2, a lug part 302 of the carried object 300 can contact the linking features 36d of the operating members 36 to drive the operating members 36 to move.

Therefore, the slide rail assembly according to the embodiments of the present invention is characterized in that:

1. The operating member 36 is operatively arranged on the first rail 30. When the operating member 36 is operated to move from the first predetermined position X1 to the second predetermined position X2, the operating member 36 is configured to move one of the working member 40 and the blocking member 38 (such as moving the working member 40 on the second rail 32), in order to keep the working member 40 and the blocking member 38 from blocking each other, so as to allow the second rail 32 to be retracted from the extension position P2 to the retracted position P1 along the retracting direction D2.

2. In contrast to the prior art having the operating member arranged with a return elastic member, the operating member 36 of the embodiments of the present invention is not arranged with any return elastic member. Therefore, the operating member 36 is not configured to be forced to move from the second predetermined position X2 to the first predetermined position X1. According to such arrangement, when the operating member 36 is operated to move from the first predetermined position X1 to the second predetermined position X2, the operating member 36 is configured to stay at the second predetermined position X2 and keep one of the working member 40 and the blocking member 38 in the non-blocking state to prevent the working member 40 and the blocking member 38 from blocking each other, such that the second rail 32 can be retracted from the extension position P2 along the retracting direction D2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail, wherein a first end part and a second end part of the first rail are configured to be fixedly mounted to a first post and a second post through a first bracket and a second bracket respectively;
a second rail movable relative to the first rail;
a blocking member arranged on one of the first rail and the second rail;
a working member arranged on the other one of the first rail and the second rail; and
an operating member operatively movable between a first predetermined position and a second predetermined position, wherein the operating member is movably mounted to the first rail without moving with the second rail;
wherein when the second rail is moved relative to the first rail from a retracted position to an extension position along an opening direction, the working member and the blocking member are configured to block each other in order to prevent the second rail from being moved from the extension position toward the retracted position along a retracting direction;
wherein when the operating member is operated to move from the first predetermined position to the second predetermined position, the operating member is configured to contact one of the working member and the blocking member, in order to keep the working member and the blocking member in a state without blocking each other, and the operating member is configured to stay at the second predetermined position without automatically returning to the first predetermined position when the operating member is no longer operated.

2. The slide rail assembly of claim 1, wherein the blocking member is arranged on the first rail and the working member is movably mounted to the second rail.

3. The slide rail assembly of claim 2, wherein the blocking member comprises a guiding section and a blocking wall; wherein during a process of the second rail being moved relative to the first rail from the retracted position to the extension position along the opening direction, the working member is configured to be guided through the guiding section to a position adjacent to the blocking wall.

4. The slide rail assembly of claim 3, wherein the working member is pivotally connected to the second rail, and the slide rail assembly further comprises an elastic member configured to provide an elastic force to the working member, such that the working member is configured to be blocked by the blocking wall in response to the elastic force.

5. The slide rail assembly of claim 1, wherein one of the operating member and the first rail is arranged with a guiding feature, and the other one of the operating member and the first rail is arranged with a mounting member configured to interact with the guiding feature to allow the operating member to move relative to the first rail.

6. The slide rail assembly of claim 5, wherein the guiding feature is a bounded longitudinal elongated hole, and the mounting member is a protruded structure penetrating through a portion of the longitudinal elongated hole.

7. The slide rail assembly of claim 1, wherein the first rail has a first side and a second side opposite to the first side, and the operating member is mounted to one of the first side and the second side.

8. A slide rail assembly, comprising:
a first rail configured to be fixedly mounted to a post through a bracket;
a second rail movable relative to the first rail;
a blocking member arranged on the first rail;
a working member arranged on the second rail; and
an operating member movably mounted to the first rail without moving with the second rail;
wherein when the second rail is moved relative to the first rail from a retracted position to an extension position along an opening direction, the working member is blocked by the blocking member;
wherein the operating member is configured to drive the working member to move to be no longer blocked by the blocking member, in order to allow the second rail to move from the extension position toward the retracted position along a retracting direction;
wherein when the operating member is operated to move from a first predetermined position to a second predetermined position, the operating member is configured to contact the working member to move the working member to be no longer blocked by the blocking member, and the operating member is configured to stay at the second predetermined position without automatically returning to the first predetermined position when the operating member is no longer operated.

9. The slide rail assembly of claim 8, further comprising a third rail movable relative to the second rail.

10. The slide rail assembly of claim 8, wherein the blocking member comprises a guiding section and a blocking wall; wherein during a process of the second rail being moved relative to the first rail from the retracted position to the extension position along the opening direction, the working member is configured to be guided through the guiding section to a position adjacent to blocking wall.

11. The slide rail assembly of claim 10, further comprising an elastic member; wherein the elastic member is configured to provide an elastic force to the working member, such that the working member is configured to be blocked by the blocking wall in response to the elastic force.

12. The slide rail assembly of claim 8, wherein one of the operating member and the first rail is arranged with a guiding feature, and the other one of the operating member and the first rail is arranged with a mounting member configured to interact with the guiding feature to allow the operating member to move relative to the first rail.

13. The slide rail assembly of claim 12, wherein the guiding feature is a bounded longitudinal elongated hole, and the mounting member is a protruded structure penetrating through a portion of the longitudinal elongated hole.

14. The slide rail assembly of claim 8, wherein the first rail has a first side and a second side opposite to the first side, and the operating member is mounted to one of the first side and the second side.

15. A slide rail assembly, comprising:
a first rail configured to be fixedly mounted to a post through a bracket;
a second rail movable relative to the first rail;
a blocking member arranged on the first rail;
a working member arranged on the second rail; and
an operating member movable relative to the first rail between a first predetermined position and a second predetermined position, wherein the operating member is movably mounted to the first rail without moving with the second rail;

wherein when the second rail is located at an extension position relative to the first rail, the working member and the blocking member are configured to block each other;

wherein when the operating member is operated to move from the first predetermined position to the second predetermined position, the operating member is configured to keep one of the working member and the blocking member in a non-blocking state to prevent the working member and the blocking member from blocking each other, in order to allow the second rail to be retractable from the extension position along a retracting direction, and the operating member is configured to stay at the second predetermined position without automatically returning to the first predetermined position when the operating member is no longer operated.

16. The slide rail assembly of claim 15, wherein the blocking member comprises a guiding section and a blocking wall; wherein during a process of the second rail being moved relative to the first rail from the retracted position to the extension position along an opening direction, the working member is configured to be guided through the guiding section to a position adjacent to blocking wall; wherein the slide rail assembly further comprises an elastic member configured to provide an elastic force to the working member, such that the working member is configured to be blocked by the blocking wall in response to the elastic force.

17. The slide rail assembly of claim 15, further comprising a third rail movable relative to the second rail.

\* \* \* \* \*